United States Patent [19]

Dearnaley

[11] Patent Number: 5,795,672
[45] Date of Patent: Aug. 18, 1998

[54] DIAMOND-LIKE CARBON BASED ELECTROCATALYTIC COATING FOR FUEL CELL ELECTRODES

[75] Inventor: Geoffrey Dearnaley, San Antonio, Tex.

[73] Assignee: Southwest Research Institute, San Antonio, Tex.

[21] Appl. No.: 674,671

[22] Filed: Jul. 2, 1996

Related U.S. Application Data

[62] Division of Ser. No. 398,281, Mar. 3, 1995, Pat. No. 5,624,718.

[51] Int. Cl.$^6$ ........................................... H01M 4/86
[52] U.S. Cl. ................................... 429/42; 429/40
[58] Field of Search ............................. 429/40, 42

[56] References Cited

U.S. PATENT DOCUMENTS 5,624,718  4/1997  Dearnalem .

*Primary Examiner*—John S. Maples
*Attorney, Agent, or Firm*—Madan & Morris, PLLC

[57] ABSTRACT

The present invention provides a low-temperature method for producing electrocatalytic coatings for fuel cell electrodes. The electrocatalytic coating comprises a thin-film of diamond-like carbon doped with finely-dispersed catalytic agent, preferably platinum, platinum-ruthenium, or other catalytically active materials. The method may be scaled-up as a highly economical reel-to-reel process comparable to the manufacture of coated polymers for food packaging applications.

12 Claims, 1 Drawing Sheet

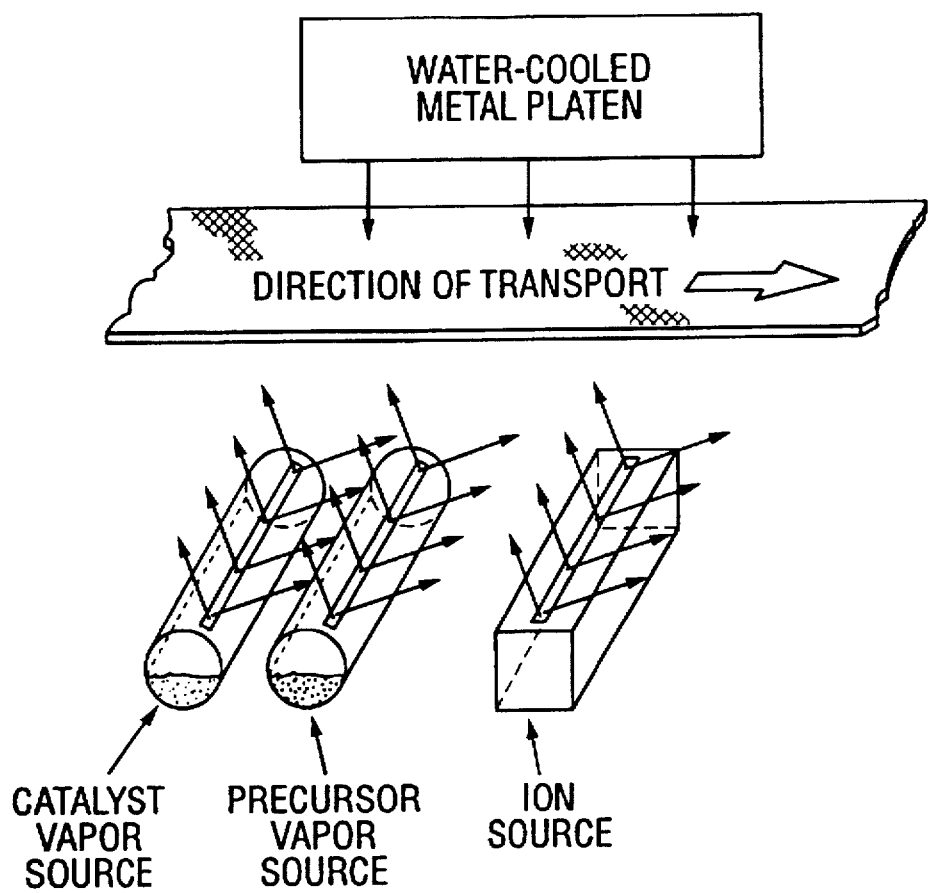

DIAMOND-LIKE CARBON BASED ELECTROCATALYTIC COATING FOR FUEL CELL ELECTRODES

This is a divisional of application Ser. No. 08/398,281 filed on Mar 3,1995, now U.S. Pat. No. 5,624,718.

FIELD OF THE INVENTION

The present invention provides a low temperature process for depositing an electrocatalytic coating for a fuel cell electrode. The electrocatalytic coating comprises a thin-film of carbon with controllable additions of platinum, platinum-ruthenium, or other catalytically active materials.

BACKGROUND OF THE INVENTION

A fuel cell is an electrochemical device in which electrical energy is generated by chemical reaction without altering the basic components of the fuel cell—that is, the electrodes and the electrolyte. The fuel cell is unique in that it converts chemical energy continuously to electrical energy without an intermediate conversion to heat energy. One advantage of fuel cells, as opposed to other energy conversion systems, is that fuel cells are relatively emission-free. With the growing emphasis on pollution control, the use of fuel cells for vehicle propulsion has become a source of renewed interest.

The operation of a fuel cell involves supplying fuel to an anode, where the fuel is ionized to free electrons and hydrogen ions. The freed electrons flow through an external circuit to the cathode. The freed hydrogen ions pass through the electrolyte to the cathode, which is supplied with oxygen. The oxygen at the cathode is ionized by the electrons, which flow into the cathode from the external circuit connected to the anode. The ionized oxygen and hydrogen ions react to form water.

Fuel cells are broadly classified by operating temperature level, type of electrolyte, and type of fuel. Low-temperature fuel cells (less than 150° C./302° F.) require a catalyst in order to increase the rate of reaction to a level that is high enough for practical use. Electrodes for low temperature fuel cells usually are porous and impregnated with the catalyst.

Some of the most efficient catalysts for low temperature fuel cells are noble metals, such as platinum, which are very expensive. Some have estimated that the cost of such catalysts is approximately 80% of the total cost of a low-temperature fuel cell. The expense of such catalysts makes it imperative to reduce the amount, or loading, of catalyst required for the fuel cell. This requires an efficient method for applying the catalyst.

Low temperature fuel cells cannot be successfully used for vehicular propulsion unless the fuel cells have a very large electrode area coated with catalytically-active material. The noble metal catalysts used in low temperature fuel cells generally perform most efficiently if they are in small clusters of nanometric dimensions on a suitable support. The support material must be: (a) electrically conducting; (b) chemically inert in the fuel cell environment; (c) mechanically robust; (d) sufficiently adherent to the cell membrane; and, (e) depositable in a thin film form, into which the platinum, or other catalyst material, can be incorporated.

A favored material for use as an electrode support material is carbon. The carbon typically is "doped" with 1–10 % platinum or platinum-ruthenium. In the past, the catalyst-doped carbon has been applied in the form of ink or using complex chemical processes that require high temperature firing, resulting in a glassy carbon that contains platinum or platinum oxide. The high temperature firing that is used to produce these electrodes cannot be used to coat the ionomer membranes that are favored for use in polymer electrolyte fuel cells (PEFC's).

A low temperature method is needed for applying electrocatalytic coatings for fuel cell electrodes.

SUMMARY OF THE INVENTION

The present invention provides a low-temperature method for producing electrocatalytic coatings for fuel cell electrodes. The electrocatalytic coating comprises a thin-film of diamond-like carbon doped with finely-dispersed catalytic agent, preferably platinum, platinum-ruthenium, or other catalytically active materials. The method may be scaled-up as a highly economical reel-to-reel process comparable to the manufacture of coated polymers for food packaging applications.

BRIEF DESCRIPTION OF THE DRAWINGS

FIG. 1 is a schematic arrangement of apparatus elements suitable for scaled-up use of the present invention.

DETAILED DESCRIPTION OF THE INVENTION

The present invention applies known procedures for forming "diamond-like carbon" ("DLC") coatings to the formation of electrocatalytic coatings for fuel cell electrodes. According to the present invention, a flux of vaporized carbon precursor and catalyst is condensed onto a desired substrate, and the substrate and condensate are bombarded with an energetic beam of ions. This form of deposition—known as ion beam-assisted deposition, or "IBAD"—results in a DLC coating with a low level of residual hydrocarbon. As a result, the DLC coating has a relatively high electrical conductivity of about 10–100 mScm$^{-1}$ (milli Siemens per cm). Due to this relatively high conductivity, the DLC formed using IBAD is sufficiently conductive to transmit the electrical output of a fuel cell.

In order to form a single fuel cell electrode according to the present invention, a suitable substrate for electrocatalytic coating should be provided. In a preferred embodiment, the substrate is a porous membrane, preferably a material known as NAFION™, which may be obtained from Dupont, Inc., Wilmington, Delaware.

The substrate should be placed in a vacuum chamber that is provided with (a) two reservoirs for vaporizing both a precursor fluid and a catalyst, and for directing the resulting flux of vapor onto the substrate, and (b) an ion gun or other apparatus for directing an ion beam onto the substrate.

In a preferred embodiment, the precursor reservoir is supplied with electrical resistance heating and the catalyst reservoir is adapted for thermal vaporization of the catalyst using electron beam heating. Alternately, the catalyst reservoir, like the precursor reservoir, may be supplied with electrical resistance heating. The composition of the electrocatalyst coating can be controlled by controlling the respective temperatures of the precursor and catalyst vapor sources. In a preferred embodiment, the ratio of carbon atoms to catalyst atoms is about 20:1. The ratio of carbon to catalyst can be quantified by Rutherford Backscattering Spectroscopy, and the resulting data can be used to determine the preferred vaporization conditions. In order to achieve a precursor/catalyst ratio of about 20:1, the precursor reservoir should be heated to between about 150° C. –170° C. (302° F. –338° F.), and the catalyst reservoir should be heated to between about 2300° C. –2600° C. (4172° F. –4712° F.).

The substrate should be placed in the vacuum chamber, and the pressure in the vacuum chamber should be pumped down to at least about $10^{-4}$ torr. As used herein, the term "in a vacuum" shall mean pressure conditions less than about $10^{-4}$ torr. The precursor and catalyst should be substantially simultaneously vaporized at predetermined rates, directed via an aperture or nozzle, and condensed onto the substrate in a vacuum. The temperature in the vacuum may vary; however, the temperature should be low enough not to damage the substrate material. Preferably, the temperature should be less than about 80° C. (176° F.). The condensation should continue until a preferred precursor coating thickness of between about 1–5 μ is achieved. The thickness of the coating may be monitored by standard methods, e.g., using the frequency change of a quartz crystal oscillator or by weighing a known area of substrate material before and after coating.

Substantially simultaneously, the substrate should be bombarded, either in a continuous or interrupted fashion, with an energetic beam of ions. Preferable ions are nitrogen, argon, hydrogen, silicon, methane, helium, or neon, having an energy between 100 eV to 100keV, preferably about 10keV. The energy of bombardment must be sufficient to ionize the constituent molecules in the precursor film, and to rupture the bonds between hydrogen and other atoms, thereby releasing the hydrogen into the surrounding vacuum to be pumped away.

The rate of arrival of the ions should be controlled in relation to the rate of arrival of the precursor\catalyst molecules. This process should require about one ion for every 100 atoms in the final product coating; however, the ion-to-atom ratio will vary according to the mass and energy of the ion species. Persons skilled in the art will recognize how to achieve the correct linear energy of transfer in the ionizing process.

The ion bombardment should be continued until an electrocatalyst coating of about 1 micron in thickness is formed. The amount of time required to form the coating will vary with the intensity of the ion beam. At an ion-to-atom ratio of about 1 to 100 and an energy of about 10 keV, about 2 minutes of ion bombardment should be sufficient. This assumes an incident current density-of about 0.2 mA per $cm^2$, which is a practicable value.

In order to scale up the procedure, a roll of substrate, preferably NAFION™, may be advanced through the vacuum chamber one segment at a time. An example of a suitable arrangement in for a scaled-up procedure is shown in FIG. 1. A current density of 0.1 mA per $cm^2$ and an ion energy of 10 keV corresponds to an incident power density of 2W per $cm^2$, which is enough to cause rapid heating of the substrate to an excessive level. Therefore, as the substrate membrane is coated, the membrane also should be cooled, preferably by passage over the surface of a water-cooled metal platen, fabricated from copper or aluminum, in order to maintain a surface temperature below 80° C.

The advancement of a sheet of substrate material through the vacuum chamber will render the seal in the vacuum chamber imperfect. In order to combat leakage from the vacuum chamber, the NAFION™, or other suitable porous membrane, preferably should be transported to the vacuum chamber via a series of chambers supplied with differential pumping to sequentially decrease the pressure in each successive chamber. The seal in the working chamber may be reinforced by sealing along the edges of the substrate as it is advanced through the chamber. For example, pressure may be applied to the edges of the substrate using strips of relatively pliable, non-porous material, such as neoprene rubber. Once the electrocatalytic coating has been formed on the substrate, the coated substrate may be wound onto a reel or other suitable vehicle for storage.

Persons of skill in the art will appreciate that many modifications may be made to the embodiments described herein without departing from the spirit of the present invention. Accordingly, the embodiments described herein are illustrative only and are not intended to limit the scope of the present invention.

I claim:

1. A fuel cell electrode bearing an electrocatalytic coating comprising a thin-film of diamond-like carbon comprising a finely-dispersed catalytic agent.

2. The fuel cell electrode of claim 1 wherein said electrode comprises an ionomeric material.

3. The fuel cell electrode of claim 2 wherein said electrode comprises NAFION™.

4. The fuel cell electrode of claim 1 wherein said catalytic agent is selected from the group consisting of platinum and a combination of platinum and ruthenium.

5. The fuel cell electrode of claim 2 wherein said catalytic agent is selected from the group consisting of platinum and a combination of platinum and ruthenium.

6. The fuel cell electrode of claim 3 wherein said catalytic agent is selected from the group consisting of platinum and a combination of platinum and ruthenium.

7. The fuel cell electrode of claim 1 wherein said electrocatalytic coating has a thickness of about 1μ.

8. The fuel cell electrode of claim 2 wherein said electrocatalytic coating has a thickness of about 1μ.

9. The fuel cell electrode of claim 3 wherein said electrocatalytic coating has a thickness of about 1μ.

10. The fuel cell electrode of claim 4 wherein said electrocatalytic coating has a thickness of about 1μ.

11. The fuel cell electrode of claim 5 wherein said electrocatalytic coating has a thickness of about 1μ.

12. The fuel cell electrode of claim 6 wherein said electrocatalytic coating has a thickness of about 1 μ.

* * * * *